(12) United States Patent
Long et al.

(10) Patent No.: US 10,483,292 B2
(45) Date of Patent: Nov. 19, 2019

(54) ARRAY SUBSTRATE AND DISPLAY PANEL

(71) Applicant: BOE TECHNOLOGY GROUP CO., LTD., Beijing (CN)

(72) Inventors: Chunping Long, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/660,999

(22) Filed: Jul. 27, 2017

(65) Prior Publication Data
US 2018/0033806 A1 Feb. 1, 2018

(30) Foreign Application Priority Data

Jul. 28, 2016 (CN) .................... 2016 2 0817837 U (51) Int. Cl.
*H01L 27/02* (2006.01)
*H01L 27/12* (2006.01)
*H01L 29/66* (2006.01)

(52) U.S. Cl.
CPC ...... *H01L 27/1244* (2013.01); *H01L 27/0266* (2013.01); *H01L 27/0296* (2013.01); *H01L 27/124* (2013.01)

(58) Field of Classification Search
CPC ............... H01L 27/124; H01L 27/1244; H01L 27/1259–1296; H01L 27/016; H01L 27/0203; H01L 27/0207; H01L 27/0218; H01L 27/0266; H01L 27/0281; H01L 27/0222; H01L 27/024; H01L 27/027; H01L 27/0251; H01L 27/0255; H01L 27/0259–0262; H01L 27/0274–0277; H01L 27/0285; H01L 27/0292; H01L 27/0296; H01L 27/32–3293; H01L 29/786–78696; H01L 2021/775; G02F 1/136–1368

USPC ......... 257/40, 72, E27.119, 59; 438/30, 158, 438/622, 585

See application file for complete search history.

(56) References Cited

U.S. PATENT DOCUMENTS

| | | | |
|---|---|---|---|
| 7,928,437 B2 * | 4/2011 | Shin | H01L 27/0248 257/59 |
| 2002/0075419 A1 * | 6/2002 | Kwon | G02F 1/136204 349/40 |
| 2003/0020845 A1 * | 1/2003 | Lee | G02F 1/136204 349/40 |
| 2005/0023614 A1 * | 2/2005 | Lai | H01L 27/0251 257/360 |

(Continued)

*Primary Examiner* — Natalia A Gondarenko
(74) *Attorney, Agent, or Firm* — Brooks Kushman P.C.

(57) ABSTRACT

The present disclosure provides an array substrate and a display device. The array substrate includes a plurality of signal lines, a plurality of secondary discharging lines arranged substantially parallel to each other, each of the plurality secondary discharging being arranged to cross the plurality of signal lines, a plurality of first electrostatic discharging units arranged in one-to-one correspondence with the plurality of signal lines, and a primary discharging line connected to the plurality of secondary discharging lines. One end of each first electrostatic discharging unit is connected to its corresponding signal line, and the other end thereof is connected to one of the plurality of secondary discharging lines.

15 Claims, 3 Drawing Sheets

(56) References Cited

U.S. PATENT DOCUMENTS

| | | | |
|---|---|---|---|
| 2007/0030408 A1* | 2/2007 | Lin | G02F 1/136204 349/40 |
| 2010/0238095 A1* | 9/2010 | Zhang | H01L 27/0266 345/82 |
| 2014/0253133 A1* | 9/2014 | Shiota | H01L 51/56 324/414 |

* cited by examiner

ARRAY SUBSTRATE AND DISPLAY PANEL

CROSS-REFERENCE TO RELATED APPLICATION

The present application claims a priority of the Chinese patent application No. 201620817837.X filed on Jul. 28, 2016, the disclosure of which is incorporated herein by reference in its entirety.

TECHNICAL FIELD

The present disclosure relates to the field of display technology, in particular to an array substrate and a display device.

BACKGROUND

Along with development of the display technology, a display panel has been applied more widely in our daily lives. For example, the display panel may be applied to a liquid crystal display device, an organic light-emitting diode (OLED) display device, an electrowetting display device, a plasma display device and an electrophoretic display device, or the like. For an array substrate, as an important member of the display panel, a gate signal, a data signal, a driver circuit control signal and any other control signal are applied to a pixel in the display panel. The data signal is transmitted in response to the gate signal, and configured to control a level of the pixel or display a desired image on the display device.

Currently, various signal lines may cross each other on the array substrate to form a complex pattern. In the case that electrostatic charges generated due to friction are applied to one or more signals lines via an interconnection structure, electrostatic breakdown may occur, thereby leading to such a circuit failure as short-circuit, and the array substrate may be damaged.

SUMMARY

An object of the present disclosure is to provide an array substrate and a display device.

In one aspect, the present disclosure provides in some embodiments an array substrate, including: a plurality of signal lines; a plurality of secondary discharging lines arranged substantially parallel to each other, each of the plurality secondary discharging being arranged to cross the plurality of signal lines; a plurality of first electrostatic discharging units arranged in one-to-one correspondence with the plurality of signal lines; and a primary discharging line connected to the plurality of secondary discharging lines. One end of each of the plurality of first electrostatic discharging units is connected to a corresponding signal line of the plurality of signal lines, and the other end is connected to one of the plurality of secondary discharging line.

In a possible embodiment of the present disclosure, the plurality of signal lines is divided into at least two groups of signal lines, each group of signal lines includes at least two signal lines, and all the signal lines belonging to an identical group are connected to an identical secondary discharging line.

In a possible embodiment of the present disclosure, each group of signal lines includes at least two signal lines adjacent to each other, and two adjacent groups of signal lines are connected to different secondary discharging lines.

In a possible embodiment of the present disclosure, two of the first electrostatic discharging units respectively connected to two adjacent signal lines of the plurality of signal lines are connected to different secondary discharging lines.

In a possible embodiment of the present disclosure, a number of the secondary discharging lines is smaller than or equal to a number of the signal lines, among the plurality of signal lines, N signal lines from an $(n*N+1)^{th}$ signal line to an $((n+1)*N)^{th}$ signal line are connected to different secondary discharging lines through first electrostatic discharging units corresponding respectively to the N signal lines, and an $i^{th}$ signal line and a $(z*N+i)^{th}$ signal line are connected to an identical secondary discharging line, where N is the number of the secondary discharging lines and is an integer greater than or equal to 2, n is a integer greater than or equal to 0, z is a positive integer, and i is a positive integer ranging from 1 to N.

In a possible embodiment of the present disclosure, there are three or two secondary discharging lines.

In a possible embodiment of the present disclosure, there are two secondary discharging lines, and among the plurality of signal lines, odd-numbered signal lines are connected to one of the secondary discharging lines through first electrostatic discharging units corresponding respectively to the odd-numbered signal lines, and even-numbered signal lines are connected to the other one of the secondary discharging lines through first electrostatic discharging units corresponding respectively to the even-numbered signal lines.

In a possible embodiment of the present disclosure, the number of the secondary discharging lines is identical to a number of subpixels of each pixel.

In a possible embodiment of the present disclosure, one pixel includes a red subpixel, a green subpixel and a blue subpixel. There are three secondary discharging lines. The plurality of signal lines includes a signal line configured to provide a signal to the red subpixel, a signal line configured to provide a signal to the green subpixel and a signal line configured to provide a signal to the blue subpixel, which are connected to the three secondary discharging lines respectively through respective first electrostatic discharging units.

In a possible embodiment of the present disclosure, the plurality of first electrostatic discharging units is arranged at an identical side of the plurality of secondary discharging lines or between two adjacent secondary discharging lines of the plurality of secondary discharging lines, or parts of the plurality of first electrostatic discharging units are located at one side of the plurality of secondary discharging lines and the other parts of the plurality of first electrostatic discharging units are located at the other side of the plurality of secondary discharging lines.

In a possible embodiment of the present disclosure, each of the plurality of first electrostatic discharging units includes a first thin film transistor (TFT) and a second TFT. A gate electrode and a source electrode of the first TFT are short-circuited and connected to a signal line corresponding to the first electrostatic discharging unit, and a drain electrode thereof is connected to a secondary discharging line corresponding to the first electrostatic discharging unit or connected to a source electrode or a drain electrode of any other TFT of the first electrostatic discharging unit. A gate electrode and a drain electrode of the second TFT are short-circuited and connected to the secondary discharging line corresponding to the first electrostatic discharging unit, and a source electrode thereof is connected to the signal line corresponding to the first electrostatic discharging unit or connected to a source electrode or a drain electrode of any other TFT of the first electrostatic discharging unit.

In a possible embodiment of the present disclosure, the first electrostatic discharging unit further includes a third TFT, a gate electrode of which is connected to the drain electrode of the first TFT, a source electrode of which is connected to the signal line, and a drain electrode of which is connected to the secondary discharging line.

In a possible embodiment of the present disclosure, an extension portion of the signal line corresponding to each first electrostatic discharging unit is formed into the source electrode of the first TFT and the source electrode of the third TFT, the source electrode of the first TFT is connected to the gate electrode of the first TFT through a via-hole, an active region of the first TFT is formed above the gate electrode of the first TFT, and the source electrode and the drain electrode of the first TFT are in direct contact with the active region of the first TFT so as to form a source region and a drain region of the first TFT.

In a possible embodiment of the present disclosure, a protrusion of the secondary discharging line is formed into the gate electrode of the second TFT, the source electrode of the second TFT is connected to the drain electrode of the first TFT through a connection line of a metal layer, an extension portion of the metal layer partially overlaps the secondary discharging line, the gate electrode of the second TFT is electrically connected to the extension portion of the metal layer through a via-hole, the extension portion of the metal layer is formed into the drain electrode of the second TFT and the drain electrode of the third TFT, the source electrode and the drain electrode of the second TFT are in direct contact with an active region of the second TFT above the gate electrode of the second TFT so as to form a source region and a drain region of the second TFT, and the source electrode and the drain electrode of the third TFT are in direct contact with an active region of the third TFT above the gate electrode of the third TFT so as to form a source region and a drain region of the third TFT.

In a possible embodiment of the present disclosure, one end of each of at least one of the plurality of secondary discharging lines is connected directly, or via a second electrostatic discharging unit, to the primary discharging line, and the other end thereof is connected to directly, or via the second electrostatic discharging unit, to the primary discharging line, or arranged in a floating state; or each of the at least one of the plurality of secondary discharging lines is of a circular structure, and is connected directly, or via the second electrostatic discharging unit, to the primary discharging line a position.

In a possible embodiment of the present disclosure, the second electrostatic discharging unit includes a first TFT and a second TFT. A gate electrode and a source electrode of the first TFT are short-circuited and connected to a secondary discharging line corresponding to the second electrostatic discharging unit, and a drain electrode thereof is connected to the primary discharging line or connected to a source electrode or a drain electrode of any other TFT of the second electrostatic discharging unit. A gate electrode and a drain electrode of the second TFT are short-circuited and connected to the primary discharging line, and a source electrode thereof is connected to the secondary discharging line or connected to a source electrode or a drain electrode of any other TFT of the second electrostatic discharging unit.

In a possible embodiment of the present disclosure, the second electrostatic discharging unit further includes a third TFT, a gate electrode of which is connected to the drain electrode of the first TFT, a source electrode of which is connected to the secondary discharging line, and a drain electrode of which is connected to the primary discharging line.

In a possible embodiment of the present disclosure, the primary discharging line is grounded or arranged in a floating state, or the primary discharging line is a common electrode line, or the primary discharging line contains a circular structure.

In a possible embodiment of the present disclosure, the plurality of signal lines comprises one of or any combination of: a data signal line, a gate signal line, a control signal line, a clock signal line and a testing signal line.

In another aspect, the present disclosure provides in some embodiments a display device including any above-mentioned array substrate.

DETAILED DESCRIPTION

The present disclosure will be described hereinafter in conjunction with the drawings and embodiments.

A shape and a size of each member in the drawings are for illustrative purposes only, but shall not be used to reflect an actual scale.

The present disclosure provides in some embodiments an array substrate which, as shown in FIGS. 1 to 6, includes: a plurality of signal lines 1; a plurality of secondary discharging lines 2 arranged substantially parallel to each other, each of the plurality of secondary discharging lines 2 being arranged to cross the plurality of signal lines 1; a plurality of first electrostatic discharging units 3 arranged in one-to-one correspondence with the plurality of signal lines 1; and a primary discharging line 4 connected to the plurality of secondary discharging lines 2. One end of each of the plurality of first electrostatic discharging units 3 is connected to its corresponding signal line 1, and the other end is connected to one of the plurality of secondary discharging line 2.

According to the array substrate in the embodiments of the present disclosure, due to the first electrostatic discharging unit 3 connected to the signal line 1 and the secondary discharging line 2, it is able to release electrostatic charges accumulated on the signal line 1 toward the secondary discharging line, thereby to prevent the occurrence of electrostatic breakdown for a circuit on the array substrate.

During an implementation, the signal lines 1 may be connected to their corresponding secondary discharging lines 2 in various ways. For example, at least two adjacent signal lines 1 may be grouped into one group, the signal lines 1 in each group may be connected to an identical secondary discharging line 2, and the signal lines 1 in two adjacent groups may be connected to different secondary discharging lines 2. For another example, three adjacent signal lines 1 may be grouped into one group, and there may be two secondary discharging lines 2. At this time, the three signal lines 1 in any group may be connected to an identical secondary discharging line 2, and the signal lines 1 in any two adjacent groups may be connected to two secondary discharging lines 2 respectively. In this way, it is able to release the electrostatic charges accumulated on the signal lines 1 to the corresponding secondary discharging lines 2.

For yet another example, in order to release the electrostatic charges accumulated on the signal lines 1 to a great extent, two first electrostatic discharging units 3 connected to the two adjacent signal lines 1 respectively may be connected to different secondary discharging lines 2. Of course, the signal lines 1 may be also be connected to the corresponding secondary discharging lines 2 in both the above-mentioned ways. In order to release the electrostatic charges accumulated on the signal lines 1 in a better effect, in the following embodiments, two first electrostatic discharging units 3 connected to two signal lines 1 respectively are connected to different secondary discharging lines 2.

During the implementation, in order to prevent normal operation of a display region from being adversely affected, usually the secondary discharging lines 2 are arranged at a non-display region. The number of the secondary discharging lines 2 is N and is smaller than or equal to the number of the signal lines 1, where N is an integer greater than or equal to 2, i.e., the number of the secondary discharging lines 2 is greater than 1 and smaller than or equal to the number of the signal lines 1. The number of the signal lines 1 may refer to the number of all the signal lines 1 connected to the secondary discharging lines 2. For example, in the case that $m_1$ data signal lines are connected to the secondary discharging lines 2 and $m_2$ gate signal lines are connected to the secondary discharging lines 2, the number of the signal lines 1 may be $m_1+m_2$, where $m_1$ and $m_2$ are each a positive integer. At this time, among the plurality of signal lines 1, an $(n*N+1)^{th}$ signal line 1 to an $((n+1)*N)^{th}$ signal line 1 are connected to different secondary discharging lines 2 through their respective first electrostatic discharging units 3, and an $i^{th}$ signal line 1 and a $(z*N+i)^{th}$ signal line 1 are connected to an identical secondary discharging line 2, where n is a integer greater than or equal to 0, z is a positive integer, and i is a positive integer ranging from 1 to N. In other words, the $(n*N+1)^{th}$ signal line 1 to the $((n+1)*N)^{th}$ signal line 1 may be connected to different secondary discharging lines 2. In this way, it is able to release the electrostatic charges accumulated on the signal lines 1 to the greatest extent, thereby to achieve an optimal effect.

Figure 1:
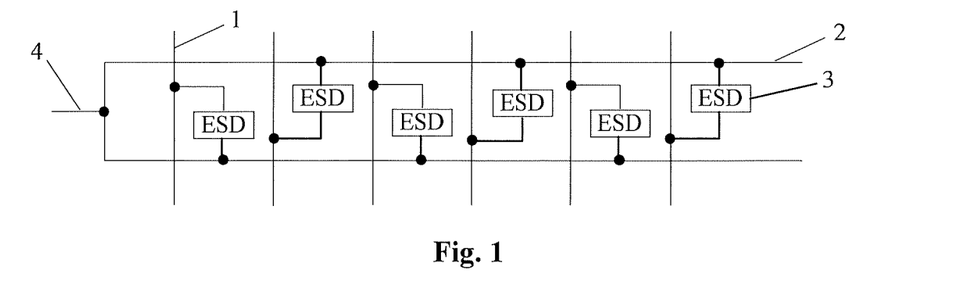
FIG. 1 is a schematic view showing an array substrate according to at least one embodiment of the present disclosure.
Figure 2:
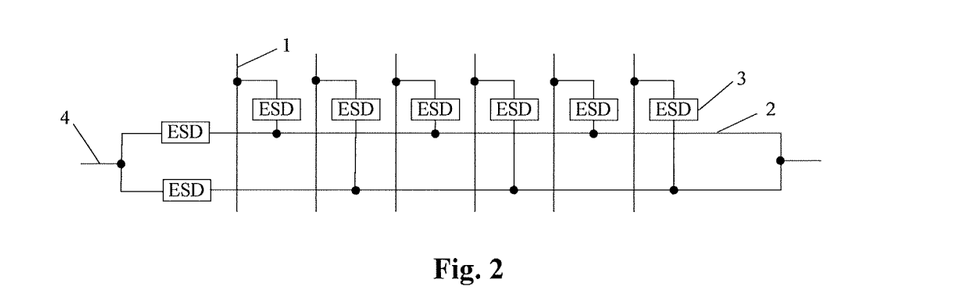
FIG. 2 is another schematic view showing the array substrate according to at least one embodiment of the present disclosure.

During the implementation, in the array substrate provided by the embodiments of the present disclosure, the number of the secondary discharging lines 2 shall not be too large. In a possible embodiment of the present disclosure, there are three or two secondary discharging lines 2, so as to facilitate a narrow-bezel design while ensuring the release of the electrostatic charges. For example, in the case that the signal line 1 is a gate signal line, as shown in FIGS. 1 and 2, two secondary discharging lines 2 may be provided, where the odd-numbered gate signal lines are connected to one of the secondary discharging lines 2 through the first electrostatic discharging units 3 corresponding respectively to the odd-numbered gate signal lines, and the even-numbered gate signal lines are connected to the other one of the secondary discharging lines 2 through the first electrostatic discharging units 3 corresponding respectively to the even-numbered signal lines. For another example, in the case that the signal line 1 is a data signal line, the number of the secondary discharging line 2 may be identical to the number of subpixels of a pixel. As shown in FIGS. 3 to 6, in the case that a pixel includes three subpixels, i.e., a red (R) subpixel, a green (G) subpixel and a blue (B) subpixel, three secondary discharging lines 2 may be provided. The data signal line for providing a display signal to the R subpixels in columns may be connected to a first one of the three secondary discharging lines 2 through its corresponding first electrostatic discharging units 3, the data signal line for providing a display signal to the G subpixels in columns may be connected to a second one of the three secondary discharging lines 2 through its corresponding first electrostatic discharging units 3, and the data signal line for providing a display signal to the B subpixels in columns may be connected to a third one of the three secondary discharging lines 2 through its corresponding first electrostatic discharging units 3.

During the implementation, in the array substrate provided by the embodiments of the present disclosure, the signal line 1 on which the accumulated electrostatic charges need to be released, which is not limited to the above-mentioned gate signal line and data signal line, also can be a control signal line, a clock signal line or a testing signal line. The signal lines 1 may comprise any combination of the gate signal line, the data signal line, the control signal line, the clock signal line or the testing signal line, which is not limited hereto.

Figure 3:
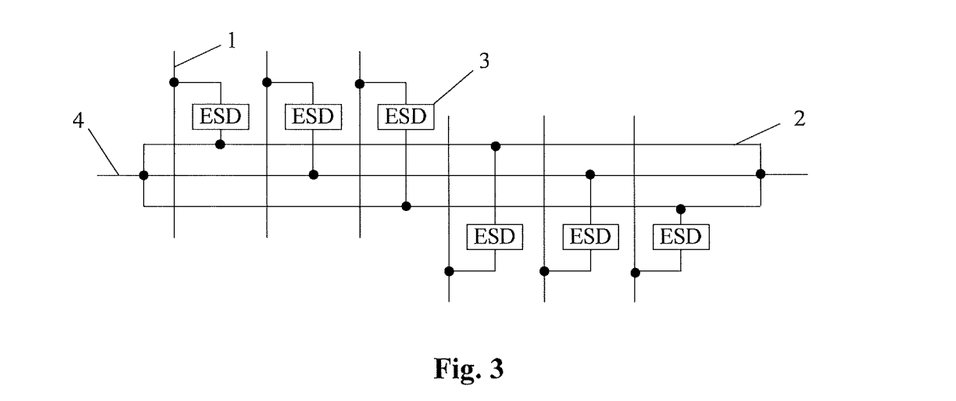
FIG. 3 is a schematic view showing the array substrate according to a first embodiment of the present disclosure.

During the implementation, in the array substrate provided by the embodiments of the present disclosure, the first electrostatic discharging units 3 may be arranged at various positions. As shown in FIG. 3, parts of the first electrostatic discharging units 3 may be arranged at one side of the secondary discharging lines 2, and the other parts may be arranged at the other side of the secondary discharging lines 2. For another example, the first electrostatic discharging units 3 may be arranged at an identical side of all the secondary discharging lines 2, as shown in FIG. 2, and 4 to 6. For yet another example, the first electrostatic discharging units 3 may be arranged between any two adjacent secondary discharging lines 2, as shown in FIG. 1. Of course, the first electrostatic discharging units 3 may also be arranged in any combination of the above-mentioned three ways, which will not be particularly defined herein.

Figure 4:
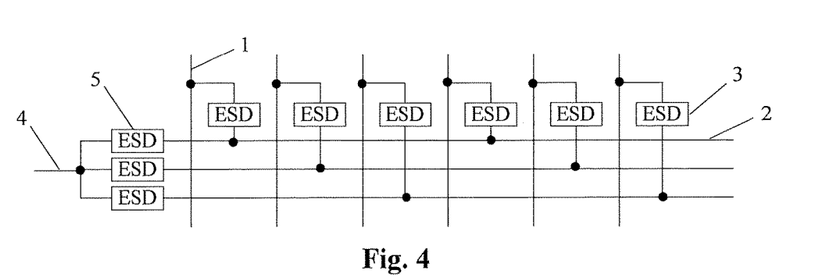
FIG. 4 is another schematic view showing the array substrate according to a second embodiment of the present disclosure.
Figure 5:
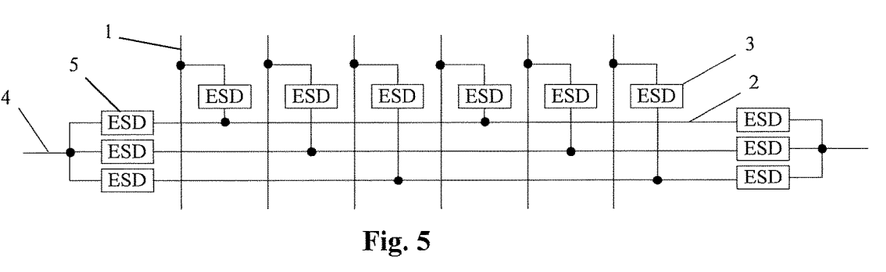
FIG. 5 is yet another schematic view showing the array substrate according to a third embodiment of the present disclosure.
Figure 6:
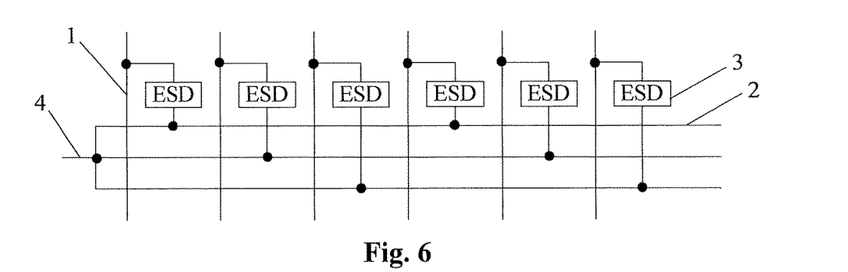
FIG. 6 is a still yet another schematic view showing the array substrate according to a fourth embodiment of the present disclosure.

During the implementation, in the array substrate provided by the embodiments of the present disclosure, the secondary discharging lines 2 may be connected to the primary discharging line 4 in various ways. As shown in FIGS. 1, 3 and 6, one end (a left end) of each secondary discharging line 2 may be directly connected to the primary discharging line 4, or as shown in FIGS. 2, 4 and 5, it may be connected to the primary discharging line 4 through a second electrostatic discharging unit 5. In addition, as shown in FIGS. 2 and 3, the other end (a right end) of each secondary discharging line 2 may be directly connected to the primary discharging line 4, or as shown in FIG. 5, it may be connected to the primary discharging line 4 through the second electrostatic discharging unit 5, or as shown in FIGS. 1, 4 and 6, it may be arranged in a floating state. The above connection mode is merely provided for the two ends of one secondary discharging line 2. For all the secondary discharging lines 2, the connection modes may be identical to, or different from, each other. For example, one end of one secondary discharging line 2 may be directly connected to the primary discharging line 4 and the other end may be arranged in the floating state, while two ends of the other secondary discharging line 2 may be connected to the primary discharging line 4 through the second electrostatic discharging unit 5.

To be specific, each secondary discharging line 2 may be a folded or straight line, or may be of a circular structure, which will not be particularly defined herein. In the case that the secondary discharging line 2 is of the circular structure, it may be directly connected to the primary discharging line 4 at least one position, or connected to the primary discharging line 4 through the second electrostatic discharging unit 5.

In addition, in the case that either end or both ends of each secondary discharging line 2 are directly connected to the primary discharging line 4, all or parts of the secondary discharging lines 2 may be connected to each other and then connected to the primary discharging line 4, or each secondary discharging line 2 may be directly connected to the primary discharging line 4.

In addition, in the case that either end or both ends of each secondary discharging line 2 are connected to the primary discharging line 4 through the second electrostatic discharging unit 5, all or parts of the secondary discharging lines 2 may be connected to each other and then connected to the primary discharging line 4 through the second electrostatic discharging unit 5, or each secondary discharging line 2 may be connected to the primary discharging line 4 through the second electrostatic discharging unit 5, which is not limited hereto.

During the implementation, in the array substrate provided by the embodiments of the present disclosure, the primary discharging line 4 may be a common electrode line, and it may be grounded, or arranged in the floating state, i.e., no signal is applied thereto, which is not limited hereto. To be specific, the primary discharging line 4 may be a folded or straight line, or it may contain a circular structure, i.e., a shape of the primary discharging line 4 will not be particularly defined herein. Usually, the primary discharging line 4 has a relatively large line width and a relatively large current-carrying capability. Apart from being connected to the secondary discharging lines 2, the primary discharging line 4 may also be connected to any other integrated circuit elements, circuit boards, flexible circuits or flexible circuit elements, so as to release the electrostatic charges accumulated thereon.

During the implementation, in the array substrate provided by the embodiments of the present disclosure, the first electrostatic discharging unit 3 may be of a structure identical to or different from the second electrostatic discharging unit 5. Usually, they may each include a plurality of TFTs. In the case that a large number of electrostatic charges are accumulated at one end of the first electrostatic discharging unit 3 or the second electrostatic discharging unit 5 and thereby a very large voltage is generated, a conductive path along which the electrostatic charges are to be transmitted may be generated between this end and the other end of the first electrostatic discharging unit 3 or the second electrostatic discharging unit 5. In the case that no electrostatic charge is accumulated at either end of the first electrostatic discharging unit 3 or the second electrostatic discharging unit 5 and thereby no sufficiently large or small voltage is generated, the conductive path may not be generated between the two ends of the first electrostatic discharging unit 3 or the second electrostatic discharging unit 5.

In a possible embodiment of the present disclosure, each first electrostatic discharging unit 3 may include at least one first TFT T1 and at least one second TFT T2. A gate electrode G1 and a source electrode S1 of the first TFT T1 are short-circuited and connected to the signal line 1, a drain electrode D1 thereof is connected to the corresponding secondary discharging line 2 or connected to a source electrode or a drain electrode of any other TFT. A gate electrode G2 and a drain electrode D2 of the second TFT T2 are short-circuited and connected to the corresponding secondary discharging line 2, and a source electrode S2 thereof is connected to the signal line 1 or connected to a source electrode or a drain electrode of any other TFT.

Figure 7:
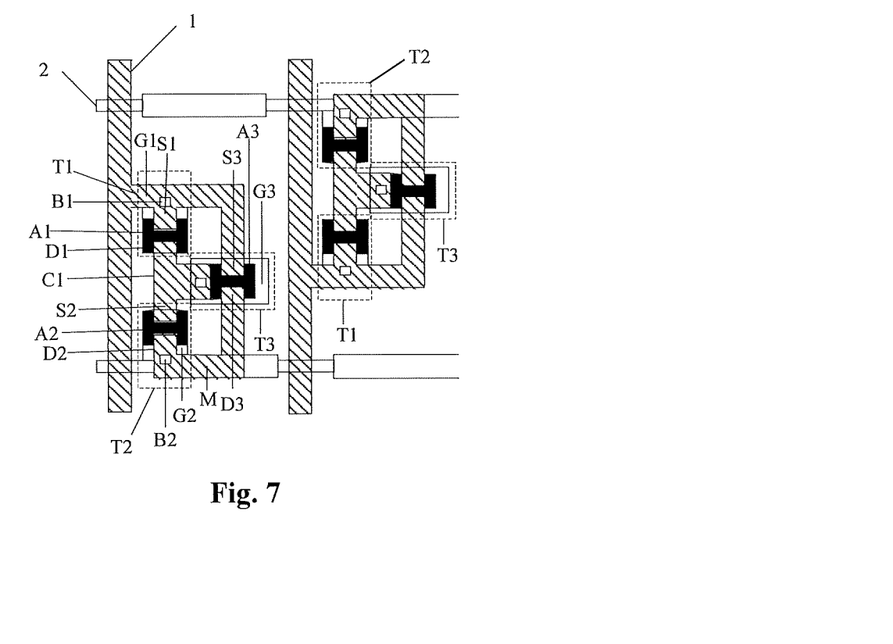
FIG. 7 is a schematic view showing a first electrostatic discharging unit of the array substrate according to at least one embodiment of the present disclosure.

For example, as shown in FIG. 7, the first electrostatic discharging unit 3 includes a first TFT T1 and a second TFT T2. The gate electrode G1 and the source electrode S1 of the first TFT T1 are short-circuited and then connected to the signal line 1, the drain electrode D1 of the first TFT T1 is connected to the source electrode S2 of the second TFT T2, and the gate electrode G2 and the drain electrode D2 of the second TFT T2 are short-circuited and then connected to the secondary discharging line 2.

During the implementation, as shown in FIG. 7, the first electrostatic discharging unit 3 may further include a third TFT T3, a gate electrode G3 of which is connected to the drain electrode D1 of the first TFT T1, a source electrode S3 of which is connected to the signal line 1, and a drain electrode D3 of which is connected to the secondary discharging line 2.

During the implementation, as shown in FIG. 7, an extension portion of the signal line 1 may be formed into the source electrode S1 of the first TFT T1 and the source electrode S3 of the third TFT T3. The source electrode S1 of the first TFT T1 may be electrically connected to the gate electrode G1 of the first TFT T1 though a via-hole B1, an active region A1 of the first TFT T1 may be formed above the gate electrode G1 of the first TFT T1, and the source electrode S1 and the drain electrode D1 of the first TFT T1 may be in direct contact with the active region A1 of the first TFT T1 to form a source region and a drain region of the first TFT T1.

During the implementation, as shown in FIG. 7, a protrusion of each secondary discharging line 2 may be formed into the gate electrode G2 of the second TFT T2. The source electrode S2 of the second TFT T2 may be connected to the drain electrode D1 of the first TFT T1 through a connection line C1 of a metal layer M (referred to as a source/drain metal layer M). An extension portion of the source/drain metal layer may partially overlap with the secondary discharging line 2, and the gate electrode G2 of the second TFT T2 may be electrically connected to the extension portion of the source/drain metal layer M through a via-hole B2. The extension portion of the source/drain metal layer may be formed into the drain electrode D2 of the second TFT T2 and the drain electrode D3 of the third TFT T3. The source electrode S2 and the drain electrode D2 of the second TFT T2 may be in direct contact with an active region A2 of the second TFT T2 above the gate electrode G2 of the second TFT T2 so as to form a source region and a drain region of the second TFT T2. In addition, the gate electrode G3 of the third TFT T3 may be electrically connected to the connection line C1 of the source/drain metal layer M through a via-hole B3. The source electrode S3 and the drain electrode D3 of the third TFT T3 may be in direct contact with an active region A3 of the third TFT T3 above the gate electrode G3 of the third TFT T3, so as to form a source region and a drain region of the third TFT T3.

The first electrostatic discharging unit 3 is not limited to the above-mentioned connection modes. For example, two via-holes may be formed above the source electrode S1 and the gate electrode G1 of the first TFT T1 respectively, and a third conductive layer, e.g., a transparent conductive layer made of a same material as a pixel electrode, may be formed at the two via-holes, so that the source electrode S1 and the gate electrode G1 of the first TFT T1 may be electrically connected to each other though the transparent conductive layer.

During the implementation, in the array substrate provided by the embodiments of the present disclosure, the second electrostatic discharging unit 5 may have a structure similar to the first electrostatic discharging unit 3 in FIG. 7. Different from the first electrostatic discharging unit 3, a first TFT T1 and a third TFT T3 of the second electrostatic discharging unit 5 are connected to the secondary discharging unit 2, and a second TFT T2 and the third TFT T3 thereof are connected to the primary discharging line 4. The description is not repeated herein.

During the implementation, the second electrostatic discharging unit 5 includes at least one first TFT T1 and at least one second TFT T2. A gate electrode G1 and a source electrode S1 of the first TFT T1 are short-circuited and connected to the corresponding secondary discharging line 2, and a drain electrode D1 thereof is connected to the primary discharging line 4 or connected to a source electrode or a drain electrode of any other TFT. A gate electrode G2 and a drain electrode D2 of the second TFT T2 are short-circuited and connected to the primary discharging line 4, and a source electrode S2 thereof is connected to the corresponding secondary discharging line 2 or connected to a source electrode or a drain electrode of any other TFT.

To be specific, in the case that the second electrostatic discharging unit 5 includes one first TFT T1 and one second TFT T2, the gate electrode G1 and the source electrode S1 of the first TFT T1 are short-circuited and then connected to the corresponding discharging line 2, the drain electrode D1 of the first TFT T1 is connected to the source electrode S2 of the second TFT T2, and the gate electrode G2 and the drain electrode D2 of the second TFT T2 are short-circuited and then connected to the primary discharging line 4.

During the implementation, in the array substrate provided by the embodiments of the present disclosure, the second electrostatic discharging unit 5 may further include a third TFT T3, a gate electrode G3 of which is connected to the drain electrode D1 of the first TFT T1, a source electrode S3 of which is connected to the corresponding secondary discharging line 2, and a drain electrode D3 of which is connected to the primary discharging line 4.

It should be appreciated that, the source electrode and the drain electrode of each TFT may be replaced with each other.

Based on an identical inventive concept, the present disclosure further provides in some embodiments a display device including the above-mentioned array substrate. The display device may be any product or member having a display function, e.g., a mobile phone, a flat-panel computer, a television, a display, a laptop computer, a digital photo frame, a navigator, or the like. The implementation of the display device may refer to that of the array substrate, and thus will not be particularly defined herein.

According to the array substrate and the display device in the embodiments of the present disclosure, the array substrate includes the plurality of signal lines, the plurality of secondary discharging lines arranged substantially parallel to each other, each of the plurality secondary discharging being arranged to cross the plurality of signal lines, the plurality of first electrostatic discharging units arranged in one-to-one correspondence with the plurality of signal lines, and the primary discharging line connected to the plurality of secondary discharging lines. One end of each of the plurality of first electrostatic discharging units is connected to the corresponding signal line, and the other end is connected to one of the plurality of secondary discharging line. As a result, it is able to release the electrostatic charges accumulated on the signal lines, thereby to prevent the occurrence of the electrostatic breakdown for a circuit on the array substrate.

Obviously, a person skilled in the art may make further modifications and improvements without departing from the spirit and scope of the present disclosure. Therefore, these modifications and improvements and equivalents thereof without departing from the technical scope of the technology disclosed in the specification shall also fall within the scope of the present disclosure.

What is claimed is:

1. An array substrate, comprising:
   a plurality of signal lines;
   a plurality of secondary discharging lines arranged substantially parallel to each other, each of the plurality of secondary discharging lines being arranged to cross the plurality of signal lines;
   a plurality of first electrostatic discharging units arranged in one-to-one correspondence with the plurality of signal lines and arranged at an identical side of an entirety of the plurality of secondary discharging lines; and
   a primary discharging line connected to the plurality of secondary discharging lines,
   wherein a first end of each of the plurality of first electrostatic discharging units is connected to a corresponding signal line of the plurality of signal lines, and a second end of the each of the plurality of first electrostatic discharging units is connected to one of the plurality of secondary discharging lines,
   each first electrostatic discharging unit of the plurality of first electrostatic discharging units comprises a first thin film transistor (TFT), a second TFT, and a third TFT;
   a gate electrode and a source electrode of the first TFT are short-circuited and connected to one of the plurality of signal lines corresponding to the each first electrostatic discharging unit, and a drain electrode of the first TFT is connected to a source electrode of the second TFT and a gate electrode of the third TFT;
   a gate electrode and a drain electrode of the second TFT are short-circuited and connected to the one of the plurality secondary discharging lines corresponding to the each first electrostatic discharging unit;
   a source electrode of the third TFT is directly connected to the one of the plurality of signal lines, and a drain electrode of the third TFT is directly connected to the one of the plurality of secondary discharging lines; and
   an extension portion of the one of the plurality of signal line corresponding to the each first electrostatic discharging unit is formed into the source electrode of the first TFT and the source electrode of the third TFT, the source electrode of the first TFT is connected to the gate electrode of the first TFT through a first via-hole, an active region of the first TFT is formed above the gate electrode of the first TFT, and the source electrode and the drain electrode of the first TFT are in direct contact with the active region of the first TFT so as to form a source region and a drain region of the first TFT.

2. The array substrate according to claim 1, wherein two of the plurality of first electrostatic discharging units connected to two adjacent signal lines of the plurality of signal lines respectively are connected to different ones of the plurality of secondary discharging lines.

3. The array substrate according to claim 2, wherein a quantity of the plurality of secondary discharging lines is smaller than or equal to a quantity of the plurality of signal lines;

N signal lines from an $(n*N+1)^{th}$ signal line to an $((n+1)*N)^{th}$ signal line among the plurality of signal lines are connected to different ones of the plurality of secondary discharging lines through ones of the plurality of first electrostatic discharging units corresponding respectively to the N signal lines, and an $i^{th}$ signal line and a $(z*N+i)^{th}$ signal line among the plurality of signal lines are connected to a same secondary discharging line of the plurality of secondary discharging lines;

wherein N is the quantity of the plurality of secondary discharging lines and is an integer greater than or equal to 2, n is an integer greater than or equal to 0, z is a positive integer, and i is a positive integer ranging from 1 to N.

4. The array substrate according to claim 3, wherein there are three secondary discharging lines.

5. The array substrate according to claim 4, wherein the quantity of the secondary discharging lines is the same as a quantity of subpixels of each pixel on the array substrate.

6. The array substrate according to claim 4, wherein each pixel on the array substrate comprises a red subpixel, a green subpixel and a blue subpixel; and the plurality of signal lines comprises a first signal line configured to provide a signal to the red subpixel, a second signal line configured to provide a signal to the green subpixel and a third signal line configured to provide a signal to the blue subpixel, wherein the first signal line, the second signal line, and the third signal line are connected to the three secondary discharging lines respectively through respective ones of the plurality of first electrostatic discharging units.

7. The array substrate according to claim 1, wherein a protrusion of the one of the plurality of secondary discharging lines is formed into the gate electrode of the second TFT, the source electrode of the second TFT is connected to the drain electrode of the first TFT through a connection line of a metal layer, an extension portion of the metal layer partially overlaps the one of the plurality of secondary discharging lines, the gate electrode of the second TFT is electrically connected to the extension portion of the metal layer through a second via-hole, the extension portion of the metal layer is formed into the drain electrode of the second TFT and the drain electrode of the third TFT, the source electrode and the drain electrode of the second TFT are in direct contact with an active region of the second TFT above the gate electrode of the second TFT so as to form a source region and a drain region of the second TFT, and the source electrode and the drain electrode of the third TFT are in direct contact with an active region of the third TFT above the gate electrode of the third TFT so as to form a source region and a drain region of the third TFT.

8. The array substrate according to claim 1, wherein a first end of each of the plurality of secondary discharging lines is connected via a second electrostatic discharging unit to the primary discharging line, and a second end of the each of the plurality of secondary discharging lines is arranged in a floating state.

9. The array substrate according to claim 1, wherein the primary discharging line is a common electrode line.

10. The array substrate according to claim 1, wherein the plurality of signal lines comprises one of or any combination of: a data signal line, a gate signal line, a control signal line, a clock signal line and a testing signal line.

11. A display device comprising the array substrate according to claim 1.

12. The array substrate according to claim 1, wherein two via-holes are formed above the source electrode and the gate electrode of the first TFT, respectively, and a third transparent conductive layer is formed at the two via-holes, and the source electrode and the gate electrode of the first TFT are electrically connected to each other through the third transparent conductive layer.

13. The array substrate according to claim 8, wherein the second electrostatic discharging unit comprises a fourth TFT and a fifth TFT, a gate electrode and a source electrode of the fourth TFT are short-circuited and connected to the each of the plurality of secondary discharging lines, and a drain electrode of the fourth TFT is connected to primary discharging line or connected to a source electrode or a drain electrode of any other TFT in the second electrostatic discharging unit;

a gate electrode and a drain electrode of the fifth TFT are short-circuited and connected to the primary discharging line, and a source electrode of the fifth TFT is connected to the each of the plurality secondary discharging lines or connected to a source electrode or a drain electrode of any other TFT in the second electrostatic discharging unit.

14. The array substrate according to claim 13, wherein the drain electrode of the fourth TFT is connected to the source electrode of the fifth TFT, the second electrostatic discharging unit further comprises a sixth TFT, a gate electrode of the sixth TFT is connected to the drain electrode of the fourth TFT, a source electrode of the sixth TFT is connected to the each of the plurality of secondary discharging line, and a drain electrode of the sixth TFT is connected to the primary discharging line.

15. The array substrate according to claim 7, wherein, the gate electrode of the third TFT is electrically connected to the connection line of the metal layer through a third via-hole.

* * * * *